(12) United States Patent
Tsen et al.

(10) Patent No.: US 9,065,274 B2
(45) Date of Patent: Jun. 23, 2015

(54) CONNECTION APPARATUS CIRCUIT AND HIGH VOLTAGE SURGE PROTECTION METHOD THEREOF

(71) Applicant: GIGA-BYTE TECHNOLOGY CO., LTD., New Taipei (TW)

(72) Inventors: Kuo Lun Tsen, New Taipei (TW); Hui Mou Wu, New Taipei (TW)

(73) Assignee: GIGA-BYTE TECHNOLOGY CO., LTD., New Taipei (TW)

( * ) Notice: Subject to any disclaimer, the term of this patent is extended or adjusted under 35 U.S.C. 154(b) by 10 days.

(21) Appl. No.: 14/076,588

(22) Filed: Nov. 11, 2013

(65) Prior Publication Data

US 2014/0153146 A1 Jun. 5, 2014

(30) Foreign Application Priority Data

Dec. 5, 2012 (TW) .............................. 101145751 A (51) Int. Cl.
| H02H 1/04 | (2006.01) |
| H02H 7/055 | (2006.01) |
| H02H 9/04 | (2006.01) |

(52) U.S. Cl.
CPC ............... *H02H 7/055* (2013.01); *H02H 9/042* (2013.01)

(58) Field of Classification Search
CPC ....................................................... H02H 3/22
USPC .................................................. 361/111, 119
See application file for complete search history.

(56) References Cited

U.S. PATENT DOCUMENTS

| 5,796,781 | A | * | 8/1998 | DeAndrea et al. ............ 375/288 |
| 5,995,353 | A | * | 11/1999 | Cunningham et al. ........ 361/111 |
| 6,741,612 | B1 | * | 5/2004 | Butler et al. .................. 370/501 |
| 7,944,668 | B2 | * | 5/2011 | Huang et al. .................. 361/111 |
| 8,077,441 | B2 | * | 12/2011 | Luo et al. ..................... 361/91.1 |
| 8,179,654 | B2 | * | 5/2012 | Tsao et al. .................... 361/111 |
| 2004/0239465 | A1 | * | 12/2004 | Chen et al. .................... 336/173 |
| 2004/0257743 | A1 | * | 12/2004 | Chen et al. .................... 361/119 |
| 2012/0040559 | A1 | | 2/2012 | Chang |
| 2012/0104857 | A1 | * | 5/2012 | Lai et al. ......................... 307/66 |
| 2014/0153146 | A1 | * | 6/2014 | Tsen et al. ...................... 361/56 |

FOREIGN PATENT DOCUMENTS

| CN | 1658464 A | 8/2005 |
| JP | 2008220146 A | 9/2008 |
| JP | 2010-278589 A | 12/2010 |
| KR | 100129712 B1 | 3/1993 |
| KR | 1020080015354 B1 | 2/2008 |

* cited by examiner

*Primary Examiner* — Ronald W Leja
(74) *Attorney, Agent, or Firm* — Chun-Ming Shih; HDLS IPR Services (57) ABSTRACT

A connection apparatus circuit includes an isolation transformer, an impedance matching network, a high-voltage capacitor and a first high-voltage surge protector. The isolation transformer has a first coil and a second coil, wherein the first coil has a first terminal, a second terminal and a center tap. The impedance matching network is coupled between the center tap and a relay terminal. The high-voltage capacitor is coupled between the relay terminal and a ground terminal. The first high-voltage surge protector is coupled between the relay terminal and the ground terminal. When a high-voltage surge exceeds a default value between the first terminal or the second terminal and the ground terminal, the first high-voltage surge protector is conducted to clamp current on the impedance matching network.

10 Claims, 11 Drawing Sheets

CONNECTION APPARATUS CIRCUIT AND HIGH VOLTAGE SURGE PROTECTION METHOD THEREOF

This application claims the benefit of the filing date of Taiwan Patent Application No. 101145751 filed on Dec. 5, 2012, in the Taiwan Intellectual Property Office, the disclosure of which is incorporated herein in its entirety by reference.

BACKGROUND

1. Technical Field

This disclosure relates to a connection apparatus circuit, and more particularly to a connection apparatus circuit provided with protection concept under a high-voltage surge.

2. Description of the Related Art

A connection apparatus is used to be a component adapted to connecting to other devices and is easy to be affected by the surrounding circumstance. Hence, it is important that the connection apparatus or a circuit thereof usually needs to pass any relative identification standards regardless of the physical or electrical concerns, so as to meet the durability requirement and reduce the erroneous rate. For example, a so called DWV test (Dielectric withstanding voltage test) is performed to apply a test voltage higher than the normal working voltage to an electrical terminal of a device under test for the duration in compliance with the standards, and the device passes the test if an electric breakdown never occurs. Moreover, a plurality of withstanding voltage tests, such as an electrostatic discharge test and so on, are performed to examine whether the device is tolerant of different kinds of high-voltage.

The objective of the withstanding voltage tests is to ensure that the electrical terminals outside the device and the circuits inside the device are well electrically insulated. Generally, a high-voltage surge may occur when suffering lightning stroke, electrostatic discharge caused by human or malfunction of a remote apparatus, which may take place in use of the device.

Figure 1:
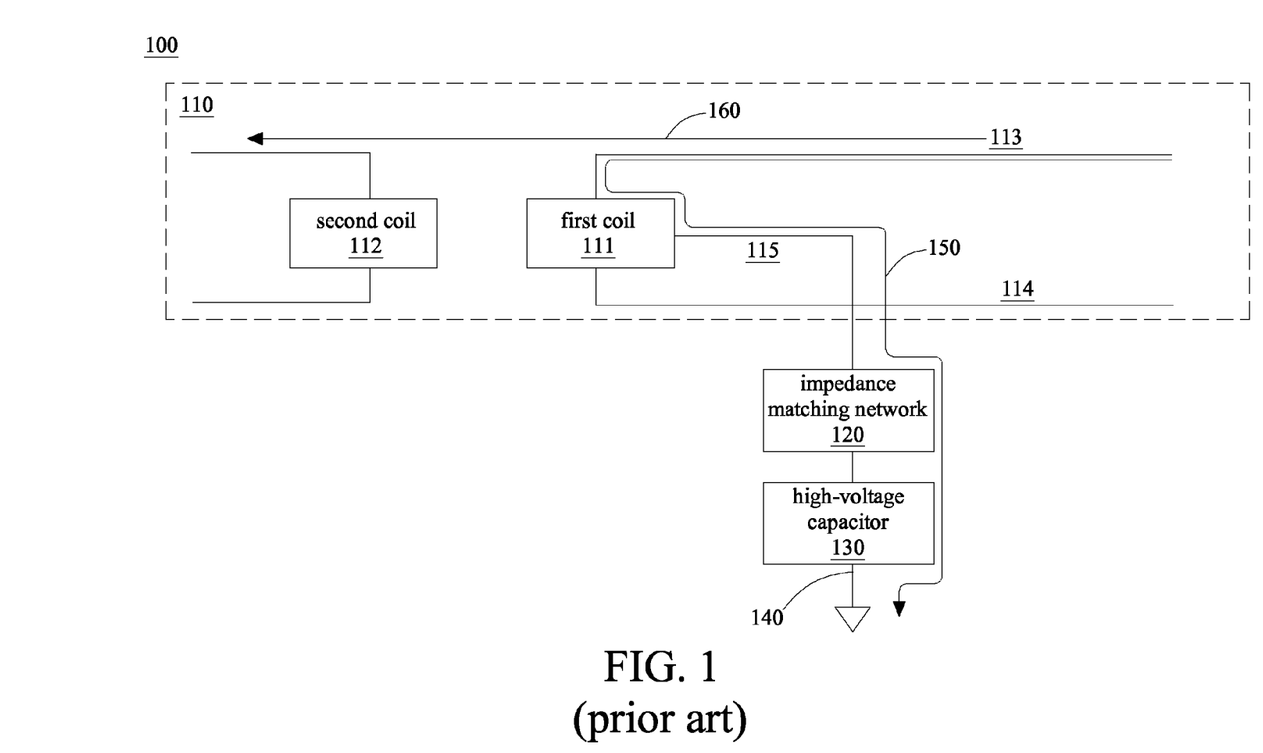
FIG. 1 is a schematic diagram of a connection apparatus circuit of the prior art.

FIG. 1 is a schematic diagram of a connection apparatus circuit 100 of the prior art which is adapted to an Ethernet system or a POTS (Plain Old Telephone Service) system. The connection apparatus circuit 100 comprises an isolation transformer 110, an impedance matching network 120, a high-voltage capacitor 130 and a ground terminal 140, wherein the isolation transformer 110 has a first coil 111 and a second coil 112, and the first coil 111 has a first terminal 113, a second terminal 114 and a center tap 115. The impedance matching network 120 and the high-voltage capacitor 130 are applicable to any matching networks for suppressing common-mode EMI (Electromagnetic Interference). That is, as a common-mode EMI signal exists between the first terminal 113 and the second terminal 114, the impedance matching network 120 and the high-voltage capacitor 130 are integrated to suppress the signal, so as to reduce impacts on the circuit. Besides, the ground terminal 140 is usually coupled to outside casings of the device and connected to the ground point via power lines.

As the FIG. 1 shown, the first terminal 113 and the second terminal 114 are used to be input/output terminals when connecting the connection apparatus to any external devices or circuits, and the signal thereof is a fully-differential AC signal. The second coil 112 is connected to inside circuit of the device. Therefore, the first coil 111 and the second coil 112 not only provide an effective insulation protection on the DC signal, but also transfer the AC signal between the inside circuit and the outside circuit, such that configuration of the connection apparatus circuit is widely used.

As the FIG. 1 shown, when a high-voltage surge occurs between the first terminal 113 and the ground terminal 140, such as suffering lightning stroke or electrostatic discharges caused by human, the high-voltage will conduct a current via the path of minimum impedance of the circuit, as the current path 150 shown, so as to release electrical charges induced by the high-voltage. However, the impedance matching network 120 is not designed to sustain the high-voltage, thus the impedance matching network 120 may suffer damages under several high-voltage surges to form an open circuit. At the same time, if one more high-voltage surge occurs, the current path generated by the high-voltage may change from the path 150 to path 160, which leads to the high-voltage being coupled inside the circuit to damage the circuit. As a result, the durability is poor and the running cost becomes higher.

Figure 2:
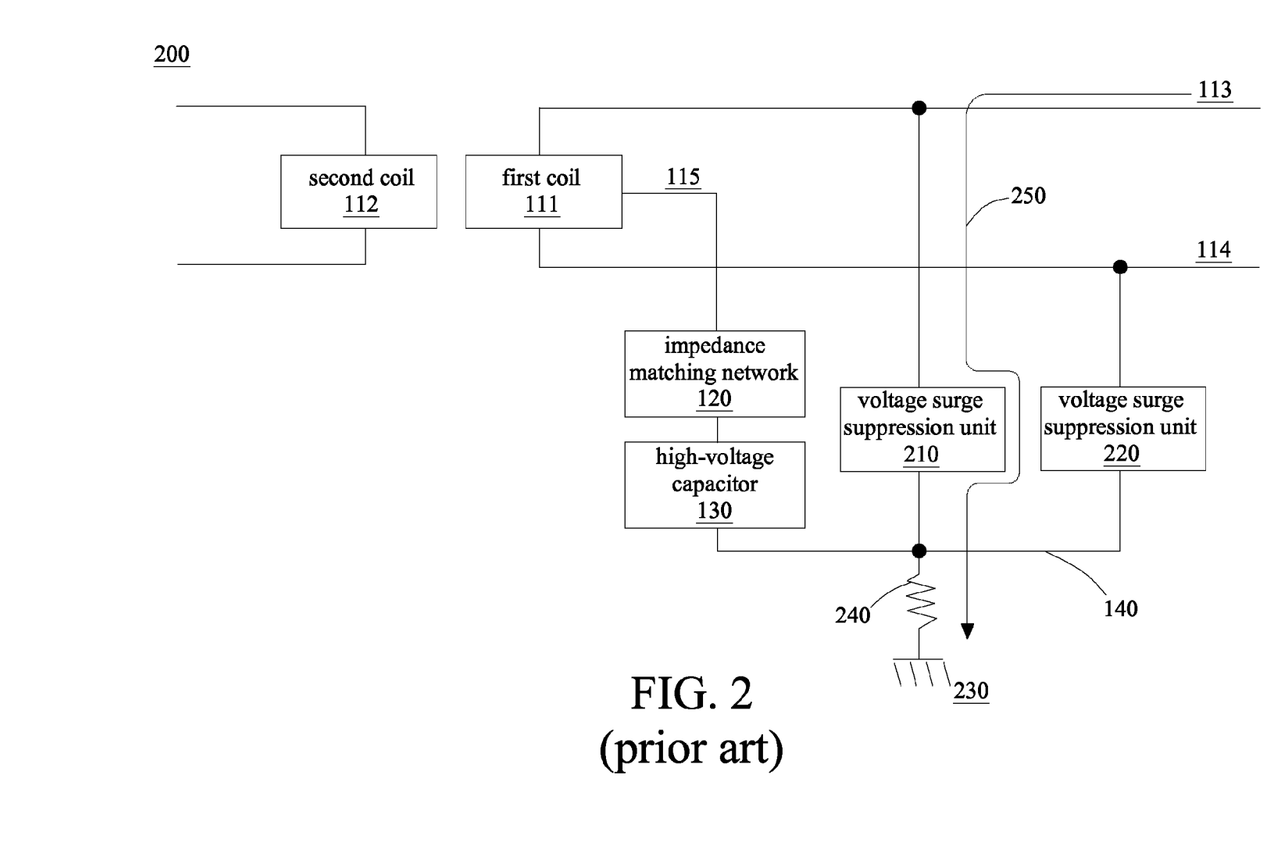
FIG. 2 is a schematic diagram of another connection apparatus circuit of the prior art.

FIG. 2 is a schematic diagram of another connection apparatus circuit 200 of the prior art. The connection apparatus circuit 200 is provided with two voltage surge suppression units 210, 220 (Transient Voltage Suppressor, TVS), which are connected between the first terminal 113, the second terminal 114 and the ground terminal 140 respectively. Besides, a parasitic resistance 240 is located between the ground point 230 and the ground terminal 140. The voltage surge suppression units 210, 220 are usually constituted of p and n type semiconductors. When a reverse bias voltage thereof is lower than a default value, such as a breakdown voltage, so as to establish equivalent high impedance, and when the reverse bias voltage is higher than the breakdown voltage, so as to establish equivalent low impedance and generate a path for conducting the current.

As the FIG. 2 shown, when a high-voltage occurs between the first terminal 113 and the ground point 230, the high-voltage is higher than the breakdown voltage of the voltage surge suppression unit 210, so as to generate the path 250 for conducting the current. When the high-voltage is caused by the electrostatic, the voltage surge suppression units 210, 220 well perform electrostatic discharges due to the response time not too long. But if the high-voltage is sustained for the duration, such as the first terminal 113 or the second terminal 114 erroneous connected to a 220-volts AC, the path 250 is generated and an AC high-voltage occurs on the ground terminal 140, so as to lead the users to expose to dangers of the electric shock when contacting the casing.

SUMMARY

In view of the foregoing prior art defects, this disclosure is to provide a connection apparatus circuit and a high voltage surge protection method thereof, which have an effective insulation protection under any high-voltage surge.

This disclosure discloses a connection apparatus circuit which comprises an isolation transformer, an impedance matching network, a high-voltage capacitor and a first high-voltage surge protector, wherein the isolation transformer has a first coil and a second coil, and the first coil has a first terminal, a second terminal and a center tap. The impedance matching network is coupled between the center tap and a relay terminal, the high-voltage capacitor is coupled between the relay terminal and a ground terminal, and the first high-voltage surge protector is coupled between the center tap and the relay terminal. When a high-voltage surge exceeds a default value between the first terminal or the second terminal and the ground terminal, the first high-voltage surge protector is conducted to clamp current on the impedance matching network.

The connection apparatus circuit of this disclosure further comprises a second high-voltage surge protector which is coupled between the relay terminal and the ground terminal. When the high-voltage surge exceeds the default value between the first terminal or the second terminal and the ground terminal, the second high-voltage surge protector is conducted to clamp current on the high-voltage capacitor.

The connection apparatus circuit of this disclosure further comprises a second isolation transformer, a second impedance matching network, a third high-voltage surge protector and a fourth high-voltage surge protector, wherein the second isolation transformer has a third coil and a fourth coil, the third coil has a third terminal, a fourth terminal and a second center tap, the second impedance matching network is coupled between the second center tap and the relay terminal, the third high-voltage surge protector is coupled between the first center tap and the second center tap, and the fourth high-voltage surge protector is coupled between the second center tap and the relay terminal. The fourth high-voltage surge protector is functioned as the first high-voltage surge protector. When the high-voltage surge occurs between the center tap and the second center tap, the third high-voltage surge protector generates a current path between the center tap and the second center tap.

In addition, each of the first high-voltage surge protector, the second high-voltage surge protector, the third high-voltage surge protector and the fourth high-voltage surge protector is a voltage surge suppression unit or/and a point discharge construction, the point discharge construction is a conductive layer formed on a circuit board and composed of a point appearance, and the point discharge construction performs point electrical discharges under the high-voltage surge.

This disclosure further discloses the high voltage surge protection method of the connection apparatus circuit, which comprises the steps of: disposing the first high-voltage surge protector between the center tap of the first coil and the relay terminal; and conducting the first high-voltage surge protector to clamp current on the impedance matching network of the connection apparatus circuit, when the high-voltage surge exceeds a default value between the center tap and the relay terminal.

This disclosure further discloses the high voltage surge protection method of the connection apparatus circuit, which further comprises the steps of: disposing the second high-voltage surge protector between the relay terminal and the ground terminal; and conducting the second high-voltage surge protector to clamp current on the high-voltage capacitor, when the high-voltage surge exceeds the default value between the relay terminal and the ground terminal.

This disclosure further discloses the high voltage surge protection method of the connection apparatus circuit, which further comprises the steps of: disposing the third high-voltage surge protector between the center tap of the first coil and the second center tap of the third coil; and conducting the third high-voltage surge protector, when the high-voltage surge exceeds the default value between the center tap and the second center tap.

The objective of the connection apparatus circuit and the high voltage surge protection method thereof is to provide an effective insulation protection under any high-voltage surge.

A detailed description is given in the following embodiments with reference to the accompanying drawings.

BRIEF DESCRIPTION OF THE DRAWINGS

This disclosure can be more fully understood by referring to the following detailed description and examples with references made to the accompanying drawings, wherein.

DETAILED DESCRIPTION OF THE DISCLOSURE

Reference will now be made in detail to the preferred embodiments of this disclosure, examples of which are illustrated in the accompanying drawings. Wherever possible, the same reference numbers are used in the drawings and the description to refer to the same or like parts. Moreover, the term "coupled" referred in this disclosure hereinafter includes any direct or indirect electrical connection ways, thereby the description "a first device is coupled to a second device" is equal to "a first device is electrical connected to a second device directly or indirectly by any means".

Figure 3:
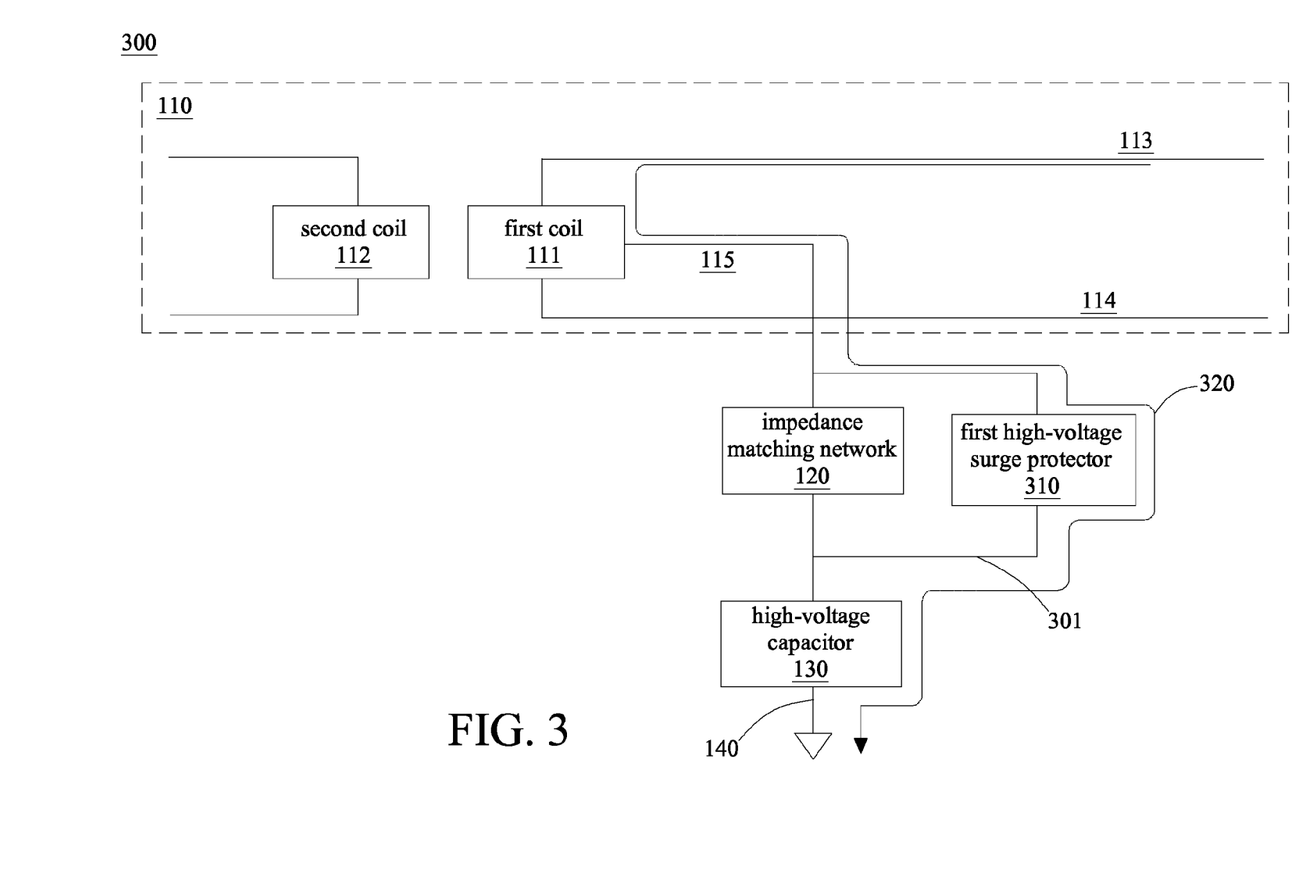
FIG. 3 is a schematic diagram of a connection apparatus circuit according to a first embodiment of this disclosure.

FIG. 3 is a schematic diagram of a connection apparatus circuit 300 according to a first embodiment of this disclosure. The connection apparatus circuit 300 is applicable to an Ethernet system or a POTS (Plain Old Telephone Service) system. The connection apparatus circuit 300 comprises an isolation transformer 110, an impedance matching network 120, a high-voltage capacitor 130, a ground terminal 140 and a first high-voltage surge protector 310, wherein the isolation transformer 110 has a first coil 111 and a second coil 112, and the first coil 111 has a first terminal 113, a second terminal 114 and a center tap 115.

The impedance matching network 120 is coupled between the center tap 115 and a relay terminal 301, the high-voltage capacitor 130 is coupled between the relay terminal 301 and the ground terminal 140, and the first high-voltage surge protector 310 is coupled between the center tap 115 and the relay terminal 301. When a high-voltage surge exceeds a default value between the first terminal 113 or the second terminal 114 and the ground terminal 140, the first high-voltage surge protector 310 is conducted to clamp current on the impedance matching network 120.

For example, when a high-voltage surge occurs between the first terminal 113 and the ground terminal 140, such as suffering lightning stroke or electrostatic discharge caused by human, the high-voltage capacitor 130 is deemed a short circuit and the high-voltage surge exceeds a voltage which can conduct the first high-voltage surge protector 310, thereby a current path 320 shown in the FIG. 1 is established to exclude extra electrical charges imposed on by the high-voltage surge. It is well noted that large current on the current path 320 never flows to the impedance matching network 120, so as to prevent the impedance matching network 120 from damaging caused by the large current. In addition, all components on the current path 320 are designed to sustain the high-voltage, so as to prolong lifetime and enhance durability of the connection apparatus circuit 300 under the high-voltage surge.

Besides, when a DC high-voltage occurs between the first terminal 113 or the second terminal 114 and the ground terminal 140, such as the first terminal 113 or the second terminal 114 erroneous connected to a 220-volts AC, the connection apparatus circuit 300 will not generate a high-voltage current path so as to provide an effective insulation protection to prevent the users from exposing to dangers of the electric shock. For example, when the DC high-voltage occurs between the first terminal 113 and the ground terminal 140, such as the first terminal 113 erroneous connected to a 220-volts AC, the high-voltage capacitor 130 is deemed an open circuit, and because the high-voltage capacitor 130 is the necessary component on the current path established between the first terminal 113 and the ground terminal 140, thus it is impossible to establish any current paths between the first terminal 113 and the ground terminal 140, which provides an effective insulation protection under the DC high-voltage to prevent the users from exposing to dangers of the electric shock.

As mentioned above, the connection apparatus circuit 300 can protect the impedance matching network 120 as encountered the high-voltage surge by using the first high-voltage surge protector 310 and the impedance matching network 120 electrically connected in parallel, so as to enhance durability of the connection apparatus circuit 300 under the high-voltage surge. Hence, it is impossible to generate any high-voltage current paths on the connection apparatus circuit 300 under the DC high-voltage, which provides an effective insulation protection for casings thereof to prevent the users from exposing to dangers of the electric shock.

Figure 4:
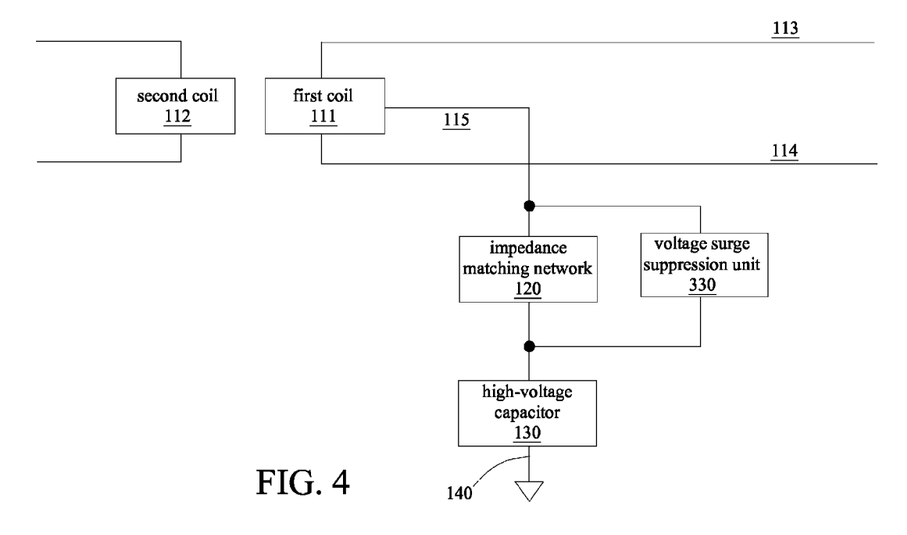
FIG. 4 is a schematic diagram of a connection apparatus circuit according to a second embodiment of this disclosure.

FIG. 4 is a schematic diagram of a connection apparatus circuit according to a second embodiment of this disclosure. As the FIG. 4 shown, a voltage surge suppression unit 330 is used to realize the first high-voltage surge protector 310 of the FIG. 3. The voltage surge suppression unit 330 is functioned to clamp current on the impedance matching network 120 under the high-voltage surge to avoid damages, and to provide an effective insulation protection for the casings under the DC high-voltage to prevent the users from exposing to dangers of the electric shock.

Figure 5:
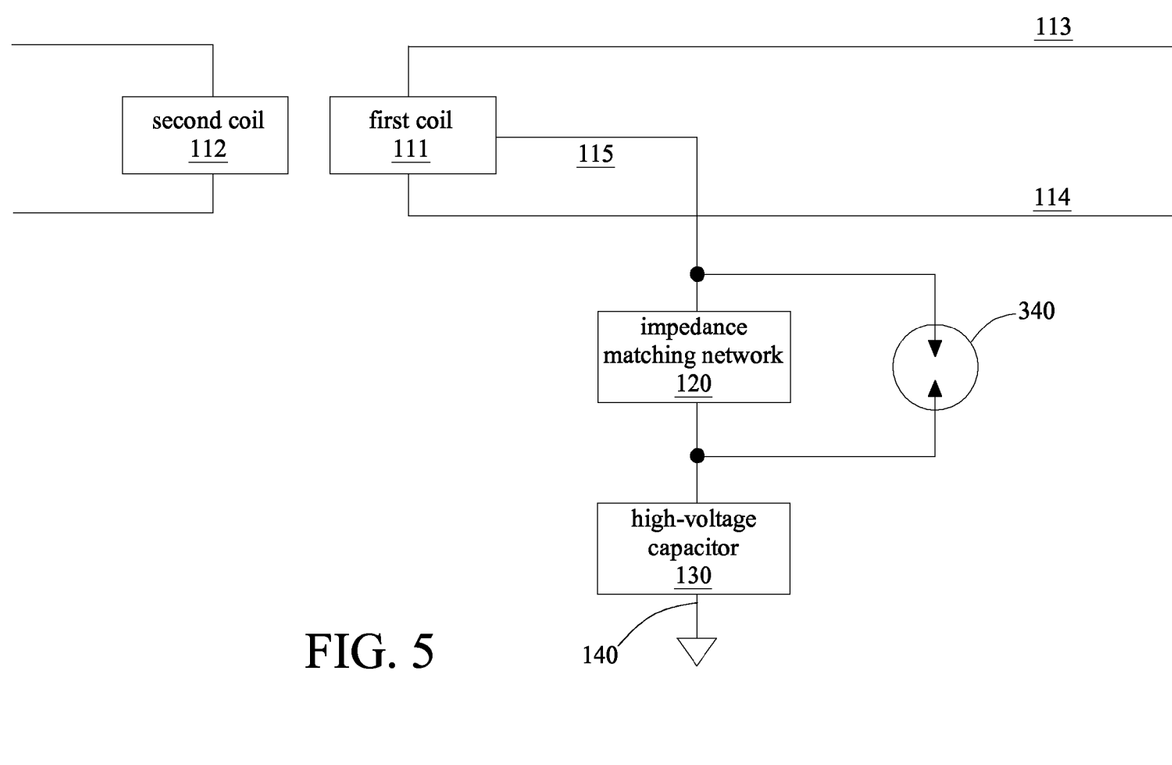
FIG. 5 is a schematic diagram of a connection apparatus circuit according to a third embodiment of this disclosure.

FIG. 5 is a schematic diagram of a connection apparatus circuit according to a third embodiment of this disclosure. As the FIG. 5 shown, a point discharge construction 340 is used to realize the first high-voltage surge protector 310 of the FIG. 3. The point discharge construction 340 is a conductive layer formed on a circuit board and composed of a point appearance, and performs point electrical discharges under the high-voltage surge. Since a point-like conductor possesses a higher electric field, the surrounding air is excited to a plurality of ionic stated molecules to be conductive. As a result, the conductive air conducts two separated conductors, and the accumulated electrical charges on the conductors flow on the path formed by the ionic stated molecules, so as to perform the electrical discharges.

Furthermore, the point discharge construction 340 is a current conductive layer formed on the circuit board of the connection apparatus circuit, which is cost saving in comparison with the additional voltage surge suppression unit. However, the voltage surge suppression unit has better reliability and responds more rapidly; therefore, it should be considered both advantages of cost saving and better reliability when designing the connection apparatus circuit.

Figure 6:
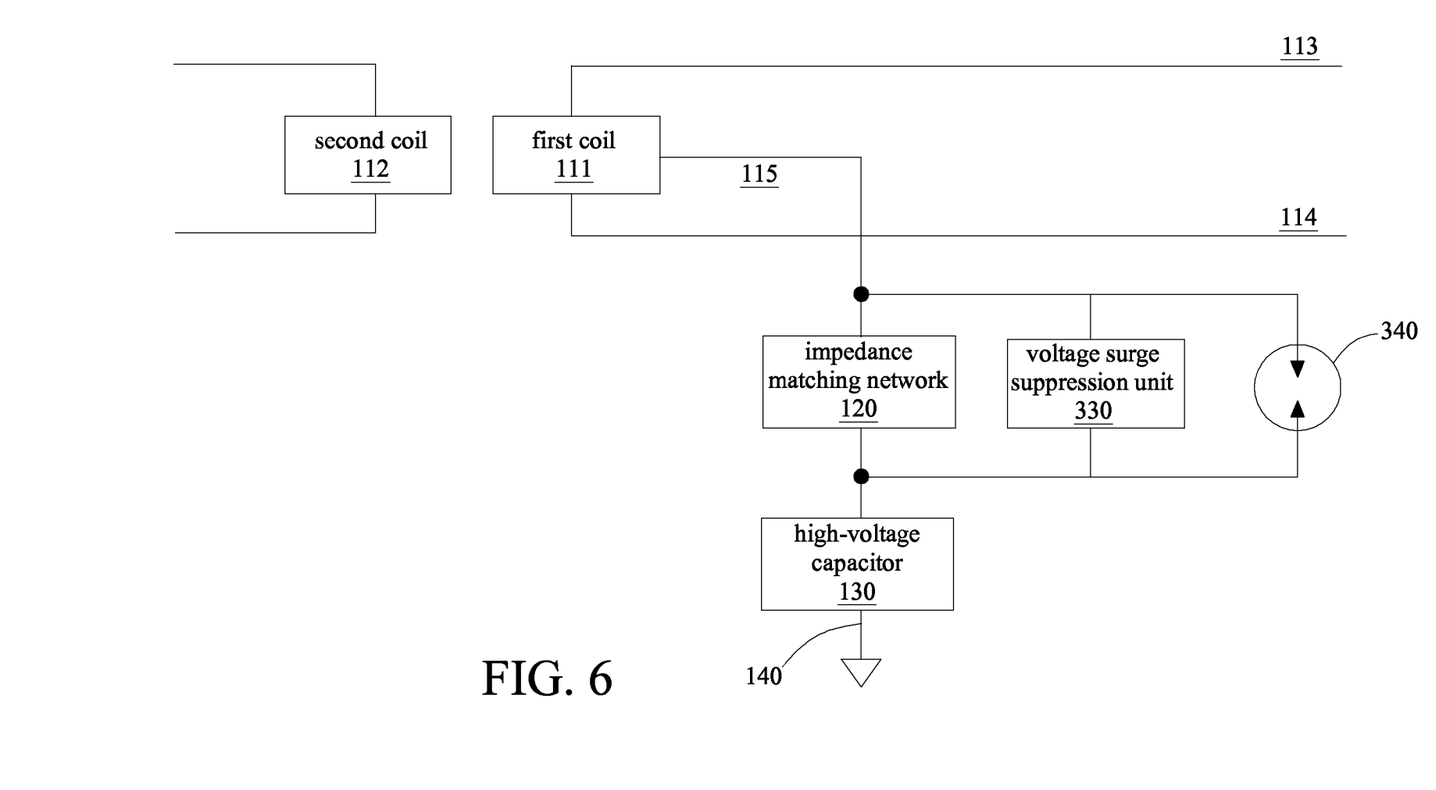
FIG. 6 is a schematic diagram of a connection apparatus circuit according to a fourth embodiment of this disclosure.

FIG. 6 is a schematic diagram of a connection apparatus circuit according to a fourth embodiment of this disclosure. As the FIG. 6 shown, a voltage surge suppression unit 330 and a point discharge construction 340 electrically connected in parallel are used to realize the first high-voltage surge protector 310 of the FIG. 3. If it is allowed to utilize the voltage surge suppression unit on cost issue, and the point discharge construction is further attached to the connection apparatus circuit, thus the reliability and durability can be enhanced with minimize cost at the same time under the high-voltage surge.

Figure 7:
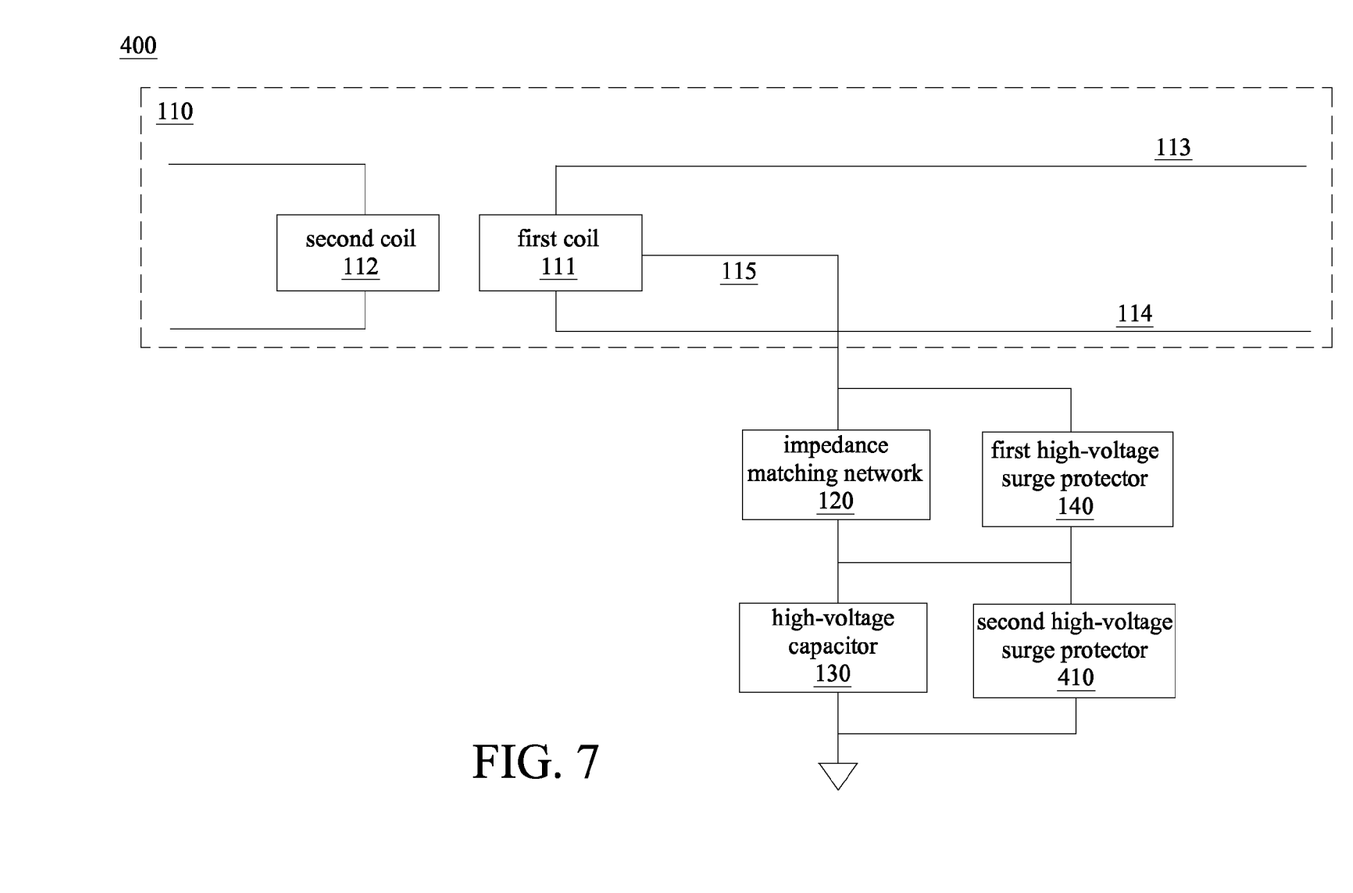
FIG. 7 is a schematic diagram of a connection apparatus circuit according to a fifth embodiment of the disclosure.

FIG. 7 is a schematic diagram of a connection apparatus circuit 400 according to a fifth embodiment of the disclosure. As the FIG. 7 shown, the connection apparatus circuit 400 further comprises a second high-voltage surge protector 410 electrically connected to the high-voltage capacitor 130 in parallel. The main objective of the second high-voltage surge protector 410 is to prevent the high-voltage capacitor 130 from damaging under the high-voltage surge. That is, the second high-voltage surge protector 410 is to be designed according to the voltage withstanding value of the high-voltage capacitor 130. Therefore, the high-voltage capacitor 130 can be protected by conducting the second high-voltage surge protector 410 before reaching the critical value of voltage withstanding thereof. Besides, the first high-voltage surge protector 310 and the second high-voltage surge protector 410 are both voltage surge suppression units or point discharge constructions, the point discharge constructions are conductive layers formed on the circuit board and composed of point appearances, and the point discharge constructions perform electrical discharges as the high-voltage surge occurs.

Figure 8:
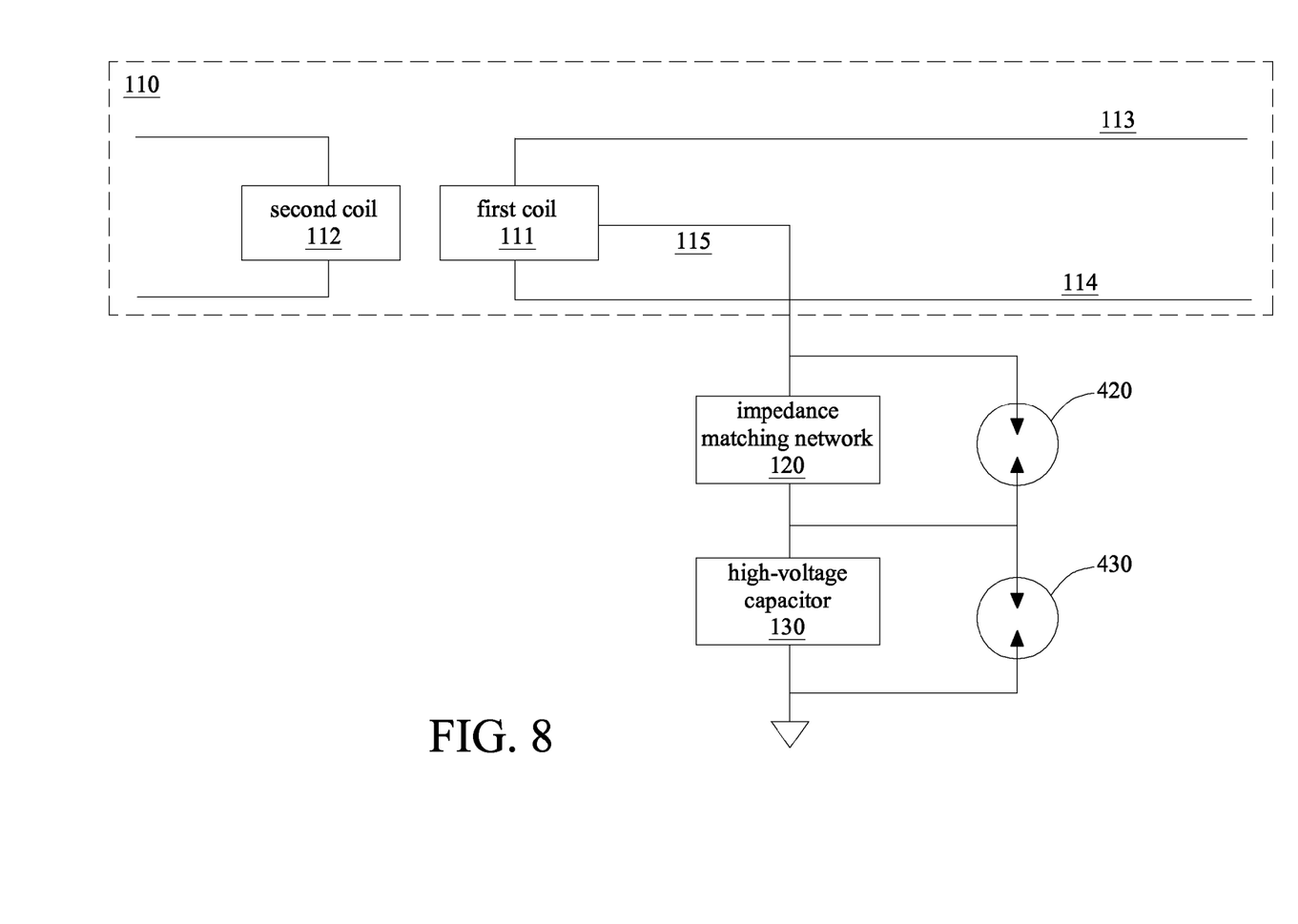
FIG. 8 is a schematic diagram of a connection apparatus circuit according to a sixth embodiment of this disclosure.

FIG. 8 is a schematic diagram of a connection apparatus circuit according to a sixth embodiment of this disclosure. As the FIG. 8 shown, two point discharge constructions 420, 430 are used to realize the first high-voltage surge protector 140 and the second high-voltage surge protector 410 of the FIG. 7. As mentioned above, each point discharge construction is realized via the conductive layer formed on the circuit board, and voltage value of the point discharge is determined by distance of the two point discharge constructions. As a result, it is easy to optimize distance of the two point discharge constructions according to the voltage withstanding value of the high-voltage capacitor 130.

Figure 9:
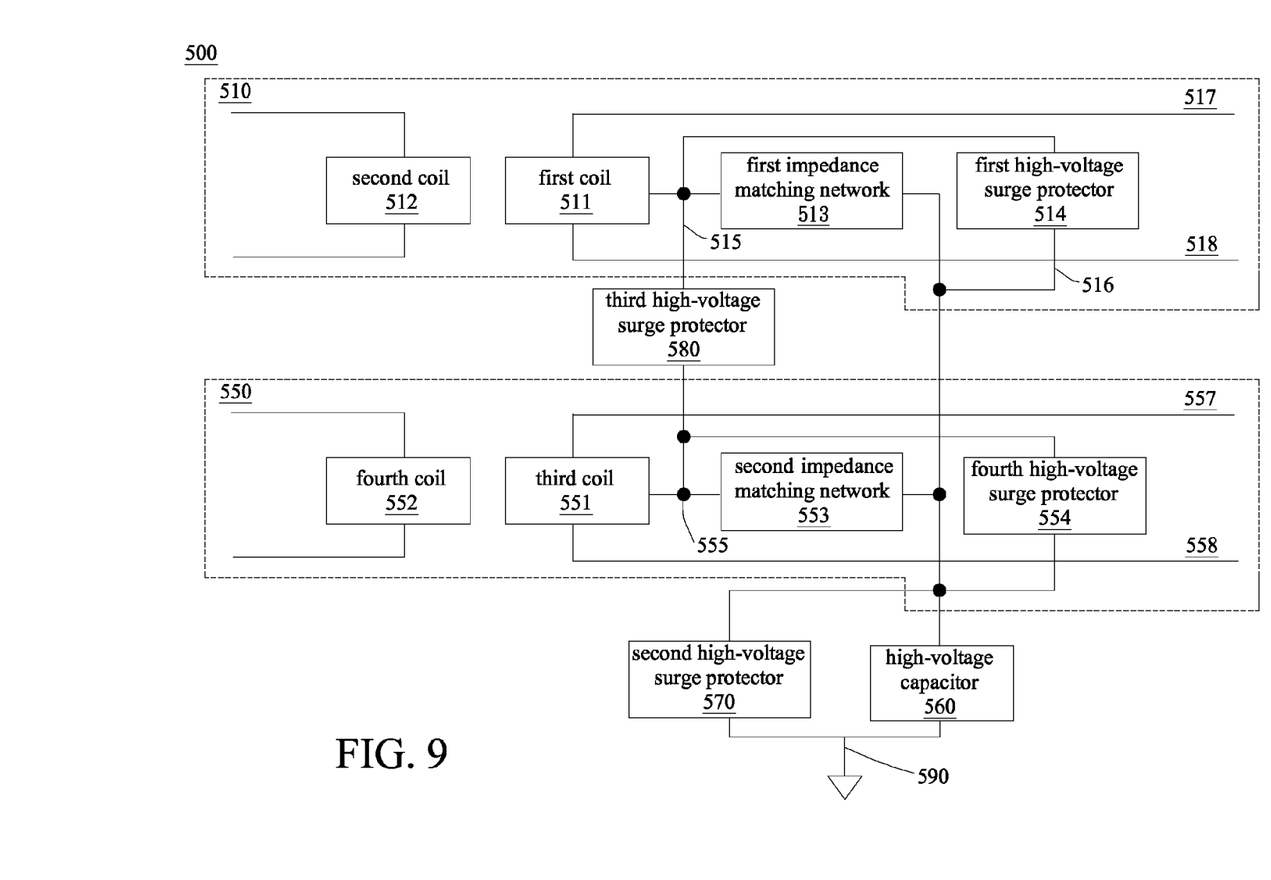
FIG. 9 is a schematic diagram of a connection apparatus circuit according to a seventh embodiment of the disclosure.

FIG. 9 is a schematic diagram of a connection apparatus circuit 500 according to a seventh embodiment of this disclosure. As the FIG. 9 shown, the connection apparatus circuit 500 comprises a first sub connection apparatus circuit 510, a second sub connection apparatus circuit 550, a second high-voltage surge protector 570, a third high-voltage surge protector 580 and a high-voltage capacitor 560. The first sub connection apparatus circuit 510 comprises a first isolation transformer, a first impedance matching network 513 and a first high-voltage surge protector 514, wherein the first isolation transformer has a first coil 511 and a second coil 512, the first coil 511 has a first terminal 517, a second terminal 518 and a first center tap 515, the first impedance matching network 513 is coupled between the first center tap 515 and a relay terminal 516, and the first high-voltage capacitor 514 is coupled between the first center tap 515 and the relay terminal 516.

As shown in the FIG. 9, the second sub connection apparatus circuit 550 comprises a second isolation transformer, a second impedance matching network 553 and a fourth high-voltage surge protector 554, wherein the second isolation transformer has a third coil 551 and a fourth coil 552, the third coil 551 has a third terminal 557, a fourth terminal 558 and a second center tap 555, the second impedance matching network 553 is coupled between the second center tap 555 and the relay terminal 516, and the fourth high-voltage protector 554 is coupled between the second center tap 555 and the relay terminal 516. In addition, the third high-voltage surge protector 580 is coupled between the first center tap 515 and the second center tap 555, the high-voltage capacitor 560 is coupled between the relay terminal 516 and a ground terminal 590, and the second high-voltage surge protector 570 is coupled between the relay terminal 516 and the ground terminal 590.

To be further explanted, the first terminal 517, the second terminal 518, the third terminal 557 and the fourth terminal 558 are used to be input/output terminals when connecting the connection apparatus circuit to any external devices or circuits. The configuration of the connection apparatus circuit 500 is that the connection apparatus circuit 400 as the FIG. 7 shown is to be a sub connection apparatus circuit, and a plurality of sub connection apparatus circuits are combined to form a connection apparatus circuit, wherein the plural sub connection apparatus circuits share the second high-voltage surge protector 410 and the high-voltage capacitor 130 as the FIG. 7 shown. Hence, the third high-voltage surge protector 580 as the FIG. 9 shown is provided to couple between the center taps of the adjacent sub connection apparatus circuits. The main objective of the third high-voltage surge protector 580 is to generate a discharge path when a high-voltage surge occurs between the two center taps. The embodiment is exemplified with that the high-voltage surge occurs between two input/output terminals of the two sub connection apparatus circuits, such as between the first terminal 517 and the fourth terminal 558. The embodiment is further exemplified with that each input/output terminal is under the high-voltage surge at the same time when suffering the lightning stroke, such that a high-voltage is established between the center taps due to the equivalent input impedances of all sub connection apparatus circuits varied. Besides, each high-voltage surge protector is a voltage surge suppression unit or a point discharge construction, the point discharge construction is a conductive layer formed on a circuit board and composed of a point appearance, and the point discharge construction performs electrical discharges when the high-voltage surge occurs.

Figure 10:
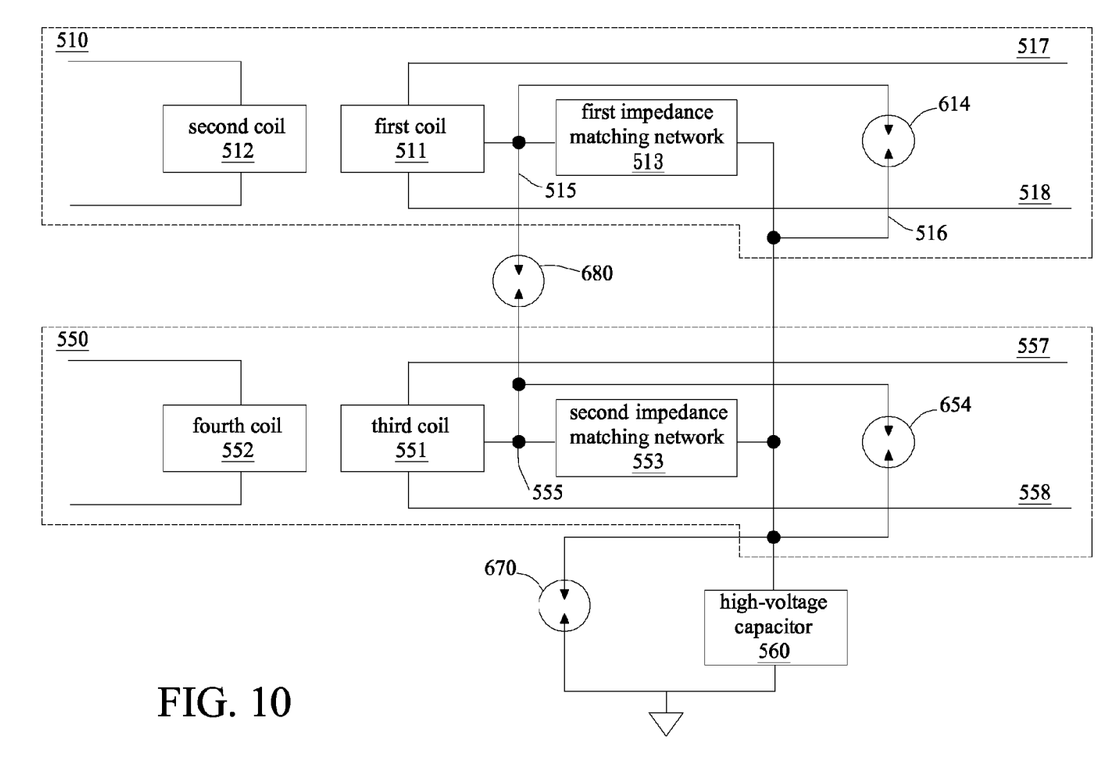
FIG. 10 is a schematic diagram of a connection apparatus circuit according to an eighth embodiment of this disclosure.

FIG. 10 is a schematic diagram of a connection apparatus circuit according to an eighth embodiment of this disclosure. As the FIG. 10 shown, four point discharge constructions 614, 670, 680, 654 are used to realize the first, second, third and fourth high-voltage surge protectors 514, 570, 580, 554 of the FIG. 9. As mentioned above, each point discharge construction is realized via the conductive layer formed on the circuit board, and voltage value of the point discharge is determined by distance of two point discharge constructions. As a result, it is easy to optimize distance of two point discharge constructions according to actual requirement.

Figure 11:
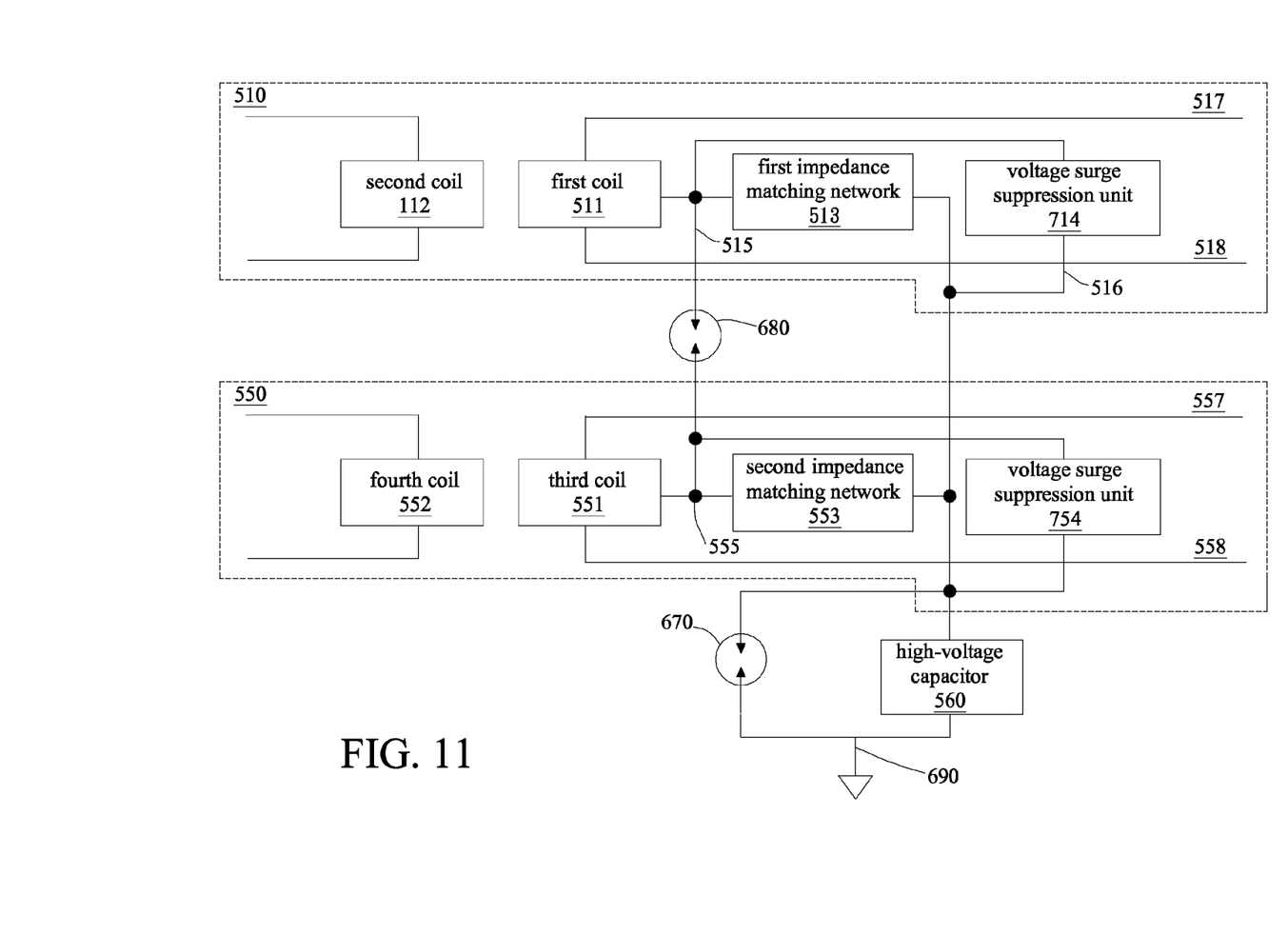
FIG. 11 is a schematic diagram of a connection apparatus circuit according to a ninth embodiment of this disclosure.

FIG. 11 is a schematic diagram of a connection apparatus circuit according to a ninth embodiment of this disclosure. As the FIG. 11 shown, two voltage surge suppression units 714, 754 are used to realize the first and fourth high-voltage surge protectors 514, 554 of the FIG. 9 respectively, and two point discharge constructions 670, 680 are further used to realize the second and third high-voltage surge protectors 570, 580 of the FIG. 9 respectively. What is difference to the eighth embodiment of the FIG. 10 is that two voltage surge suppression units 714, 715 are provided to prevent the first and second impedance matching networks 513, 553 from damaging under the high-voltage surge. Because the first and second impedance matching networks 513, 553 both have low tolerance to the high-voltage surge, the voltage surge suppression units can be used to protect the impedance matching networks and enhance durability of the connection apparatus circuit under the high-voltage surge as a whole.

The objective of the connection apparatus circuit and the high voltage surge protection method thereof is to provide an effective insulation protection under the high-voltage surge.

While this disclosure has been described by way of example and in terms of the preferred embodiments, it is to be understood that this disclosure is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. A connection apparatus circuit comprising:
an isolation transformer having a first coil and a second coil, wherein the first coil has a first terminal, a second terminal and a center tap;
an impedance matching network coupled between the center tap and a relay terminal;
a high-voltage capacitor coupled between the relay terminal and a ground terminal; and
a first high-voltage surge protector coupled between the center tap and the relay terminal;
wherein when a high-voltage surge exceeds a default value between the first terminal or the second terminal and the ground terminal, the first high-voltage surge protector is conducted to clamp current on the impedance matching network; wherein when a DC high-voltage occurs between the first terminal or the second terminal and the ground terminal, the high-voltage capacitor is an open circuit to break current path between the first terminal or the second terminal and the ground terminal.

2. The connection apparatus circuit as claimed in claim 1, wherein the first high-voltage surge protector is a voltage surge suppression unit or a point discharge construction, the point discharge construction is a conductive layer formed on a circuit board and composed of a point appearance, and performs point electrical discharges under the high-voltage surge.

3. The connection apparatus circuit as claimed in claim 1, wherein the first high-voltage surge protector is constituted of a voltage surge suppression unit and a point discharge construction electrically connected in parallel, the point discharge construction is a conductive layer formed on a circuit board and composed of a point appearance, and the point discharge construction performs point electrical discharges when the high-voltage surge occurs.

4. The connection apparatus circuit as claimed in claim 1, further comprising a second high-voltage surge protector coupled between the relay terminal and the ground terminal, when the high-voltage surge exceeds the default value between the first terminal or the second terminal and the ground terminal, the second high-voltage surge protector is conducted to clamp current on the high-voltage capacitor.

5. The connection apparatus circuit as claimed in claim 4, wherein the second high-voltage surge protector is a voltage surge suppression unit or a point discharge construction, the point discharge construction is a conductive layer formed on a circuit board and composed of a point appearance, and the point discharge construction performs point electrical discharges when the high-voltage surge occurs.

6. The connection apparatus circuit as claimed in claim 4, further comprising:

an second isolation transformer having a third coil and a fourth coil, wherein the third coil has a third terminal, a fourth terminal and a second center tap;

an second impedance matching network coupled between the second center tap and the relay terminal;

a third high-voltage surge protector coupled between the center tap and the second center tap; and a fourth high-voltage surge protector coupled between the second center tap and the relay terminal.

7. The connection apparatus circuit as claimed in claim 6, wherein the third high-voltage surge protector and the fourth high-voltage surge protector are a voltage surge suppression unit and/or a point discharge construction respectively, the point discharge construction is a conductive layer formed on a circuit board and composed of a point appearance, and the point discharge construction performs point electrical discharges when the high-voltage surge occurs.

8. A high voltage surge protection method of a connection apparatus circuit, the connection apparatus circuit comprising an isolation transformer having a first coil and a second coil, wherein the first coil has a first terminal, a second terminal and a center tap, the method comprising:

disposing a impedance matching network between the center tap and a relay terminal;

disposing a first high-voltage surge protector between the center tap and the relay terminal;

disposing a high-voltage capacitor between the relay terminal and a ground terminal;

conducting the first high-voltage surge protector to clamp current on the impedance matching network, when a high-voltage surge exceeds a default value between the center tap and the relay terminal; and opening the high-voltage capacitor to break current path between the first terminal or the second terminal and the ground terminal, when a DC high-voltage occurs between the first terminal or the second terminal and the ground terminal.

9. The method as claimed in claim 8, further comprising:

disposing a second high-voltage surge protector between the relay terminal and a ground terminal; and conducting the second high-voltage surge protector to clamp current on a high-voltage capacitor, when the high-voltage surge exceeds the default value between the relay terminal and the ground terminal.

10. The method as claimed in claim 9, further comprising:

disposing a third high-voltage surge protector between the center tap of the first coil and a second center tap of a third coil; and conducting the third high-voltage surge protector, when the high-voltage surge exceeds the default value between the center tap and the second center tap.

\* \* \* \* \*